US007385335B2

(12) United States Patent
Biagetti et al.

(10) Patent No.: US 7,385,335 B2
(45) Date of Patent: Jun. 10, 2008

(54) METERING DEVICE WITH AN ELECTRICAL CONNECTOR

(75) Inventors: Fabrizio Biagetti, Leghorn (IT); Valerio Polidori, Leghorn (IT)

(73) Assignee: Siemens VDO Automotive SpA, Fauglia/Pisa (IT)

( * ) Notice: Subject to any disclaimer, the term of this patent is extended or adjusted under 35 U.S.C. 154(b) by 389 days.

(21) Appl. No.: 11/183,268

(22) Filed: Jul. 15, 2005

(65) Prior Publication Data

US 2005/0250366 A1 Nov. 10, 2005

Related U.S. Application Data

(63) Continuation of application No. PCT/EP03/09488, filed on Aug. 27, 2003.

(30) Foreign Application Priority Data

Jan. 24, 2003 (EP) ................................ 03001634

(51) Int. Cl.
*H01L 41/08* (2006.01)

(52) U.S. Cl. ................................................ 310/328

(58) Field of Classification Search ................ 310/328, 310/366, 364, 335; 439/24, 172, 701; 239/97, 239/102.2; 123/291; *H01L 41/08*
See application file for complete search history.

(56) References Cited

U.S. PATENT DOCUMENTS

| | | | | |
|---|---|---|---|---|
| 5,059,857 | A * | 10/1991 | Brandt et al. | 310/366 |
| 5,168,189 | A * | 12/1992 | Dam et al. | 310/328 |
| 6,400,066 | B1 | 6/2002 | Sumrak et al. | 310/346 |
| 6,875,058 | B2 * | 4/2005 | Brock et al. | 439/638 |
| 2002/0139864 | A1 | 10/2002 | Lorraine et al. | 239/5 |

FOREIGN PATENT DOCUMENTS

| | | | |
|---|---|---|---|
| DE | 197 15 487 | A1 | 4/1997 |
| DE | 100 39 218 | A1 | 8/2000 |
| EP | 1 079 097 | A2 | 8/2000 |
| EP | 1 096 136 | A2 | 10/2000 |
| EP | 1 111 230 | A2 | 12/2000 |

OTHER PUBLICATIONS

International Search Report, PCTEP03/09488, 4 pgs.

* cited by examiner

*Primary Examiner*—Dan Schuberg
*Assistant Examiner*—Karen Beth Addison
(74) *Attorney, Agent, or Firm*—Baker Botts L.L.P.

(57) ABSTRACT

The invention relates to a metering device for dosing pressurized fluids, comprising a housing with a metering opening, controlled an axially moveable valve needle, an axially extendable piezoelectric actuator, a thermal compensator unit, and an electrical connector for supplying electrical power to the piezoelectric actuator.

22 Claims, 2 Drawing Sheets

METERING DEVICE WITH AN ELECTRICAL CONNECTOR

CROSS-REFERENCE TO RELATED APPLICATION

This application is a continuation of co-pending International Application No. PCT/EP03/09488 filed Aug. 27, 2003, which designates the United States, and claims priority to European application number EP03001634.9 filed Jan. 24, 2003.

TECHNICAL FIELD

The present invention relates to a metering device for dosing pressurized fluids, particularly an injection valve for a fuel injection system in an internal combustion engine.

BACKGROUND

The metering device is of the type which comprises a housing having a metering opening, whose opening and closing is controlled by the movement of an axially moveable valve needle, an axially extendable piezoelectric actuator cooperating with the valve needle to control its axial movement, a thermal compensator unit cooperating with the piezoelectric actuator and the housing to compensate for different thermal expansion of the housing and the piezoelectric actuator to ensure elastic contact between an end stop of the housing, the piezoelectric actuator and the valve needle, and an electrical connector for supplying electrical power to the piezoelectric actuator.

In such metering devices the housing and the piezoelectric actuator are generally fabricated from different materials and have different thermal coefficients of expansion. Therefore, special measures must be taken to ensure that the injector valve meets the requirements on the fuel flow rate and the geometry of the jet. Particularly important is the influence of the temperature on the principal functional parameters of the injector. The flow rate and other characteristic parameters must remain within predetermined limits of tolerance throughout the full range of the operating temperatures ranging from −40° C. to +150° C.

Specifically, as the piezoelectric actuator generally has a lower coefficient of thermal expansion than the outer housing, it would not maintain Hertzian contact between its fixed end stop surface and the top end of the valve needle. To deal with this problem, the injector valve is typically equipped with a hydraulic thermal compensation unit. As the operation temperature increases, the thermal compensation unit recovers the clearance that would otherwise be created between the valve needle and the piezoelectric actuator.

Due to this fact, the electrical wiring, which connects the upper side of the piezoelectric actuator with the outer side of the injector body, must likewise permit the axial movements, i.e. the extensions and the contractions of the thermal compensator subgroup with high frequency while still providing a reliable electrical connection to the piezoelectric actuator. In current designs, a bipolar and flexible wire coming out of the injector body provides the electrical connection to the piezoelectric actuator. Such a solution, however, can only be employed for test specimens and is not feasible for the standard production of injectors.

In view of the foregoing, it is an object of the present invention to provide a metering device of the above mentioned type with an improved electrical connector which allows for rapid axial movements of the thermal compensator.

SUMMARY

According to the invention, the metering device provides an electrical connector comprising a connector body containing a first set of pins adapted to be connected with an external power supply, and a second set of pins electrically connected to the first set of pins and providing electrical contact to the piezoelectric actuator, wherein the first set of pins is rigidly mounted in the connector body and wherein the second set of pins is axially moveably mounted in the connector body to permit rapid axial movement of the thermal compensator unit.

In a preferred embodiment of the invention, each of the pins of the first set has a first end piece and a second end piece, wherein the first end pieces are adapted to be connected with the external power supply and the second end pieces are electrically connected to the axially moveable pins of the second set.

It is further preferred that each of the pins of the second set has a first end piece and a second end piece, wherein the first end pieces provide electrical contact to the piezoelectric actuator and the second end pieces are fixed and electrically connected to the second end pieces of the first set of pins.

The second end pieces of the second set of pins may advantageously be welded or braised to the second end pieces of the first set of pins.

Preferably, the second end pieces of the second set of pins have a flexible bending area allowing axial oscillations of the pins of the second set. In a preferred embodiment of the invention, the flexible bending area is formed in an divergent "L" shape.

According to a further advantageous embodiment of the invention, the electrical connector comprises a molded connector body, encapsulating the pins with the exception of their first and second end pieces.

An electrical resistor may be connected between a first and a second pin of the first set of pins. Advantageously, the electrical resistor is at least partially encapsulated by the connector body.

It is further preferred, that the connector body comprises at least one fastening hole to receive a fastening member for attaching the connector body to the housing of the metering device. One or more screws or other fastening members may then be inserted in the fastening holes to easily and removably fasten the connector body to the housing.

Additionally or alternatively, the connector body may comprise at least one metal insert adapted to be welded to the housing of the metering device. Such a welded joint provides a stable and durable connection.

Further, the connector body and the housing of the metering device may comprise corresponding engagement means to attach the electrical connector to the housing of the metering device. This method offers a simple and quick connection of the connector to the device housing.

In a further preferred embodiment of the invention, the electrical connector is provided with a protective cap preserving the axial oscillation area of the second end pieces of the second pin set atop an outlet surface of the connector body.

The protective cap is preferably ultrasonically welded to a upper surface of the connector body to provide a secure and tight connection.

In order to improve the insulation against water and contaminants such as gasoline, a sealing element is provided between the connector body and the housing of the metering device. Preferably, the sealing element is formed by a sealing ring such as an O-ring.

Other sealing elements may be included between the body and an electrical adapter to prevent contaminants from entering the injector body during the calibration process, if the protective cap is not yet present. However, with the most embodiments, during the calibration process, the cap is already ultrasonic welded on the body.

In addition to the advantages mentioned above, the advantages gained by the technical features of the invention include:

- no overmolding is required, as there are no components to overmold onto during the molding process;
- the injector is easy to assemble;
- there are different ways to fix the electrical connector to the housing;
- it is possible to insert different types of resistors; and
- no water, gasoline or vapor intrusions are possible.

BRIEF DESCRIPTION OF THE DRAWINGS

The invention, both its construction an its method of operation together with additional objects and advantages thereof, will best be understood from the following description of specific embodiments when read in connection with the accompanying drawings, wherein.

DETAILED DESCRIPTION

Figure 1:
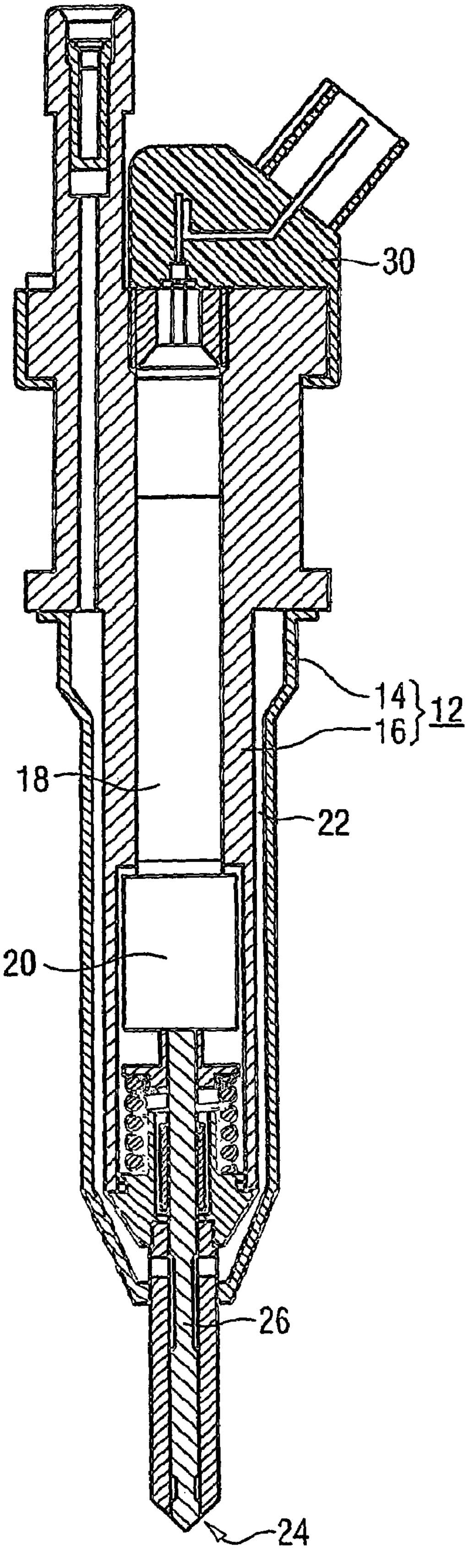
FIG. 1 is a schematic axial cross section of an injector valve with an electrical connector according to an embodiment of the invention.

FIG. 1 shows an injection valve for direct-injection gasoline engines, generally designated by 10. The injection valve has a housing 12, which comprises an outer tubular member 14 and an inner tubular member 16.

The outer tubular member 14 forms the outer jacket of the injection valve 10, and the inner tubular member 16 contains the piezoelectric actuator 18 and the thermal compensator subgroup 20. The passage 22 formed between the outer tubular member 14 and the inner tubular member 16 provides a large annular pathway which transports the gasoline supplied by a entry duct to gasoline admission holes and into the outlet passage 24 of the injector valve 10.

To open the injection valve 10 to inject gasoline into the engine cylinder, an excitation voltage is applied to the piezoelectric actuator 18 by an electrical connector 30, which is described in detail below. In response to the excitation voltage, the piezoelectric actuator 18 increases in length in axial direction by a predetermined amount, typically about ten or several tens of micrometers. This extension in length is transmitted to a valve needle 26 disposed in the outlet passage 24, which depresses a biasing spring and lifts from its seat. In this position, the injection of pressurized gasoline in the cylinder starts.

When the excitation voltage supplied by the electrical connector 30 is switched off, the length of the piezoelectric actuator 18 in axial direction decreases to its normal value, whereby the biasing pressure of the helical spring forces the valve needle 26 back to its closing position.

Figure 2:
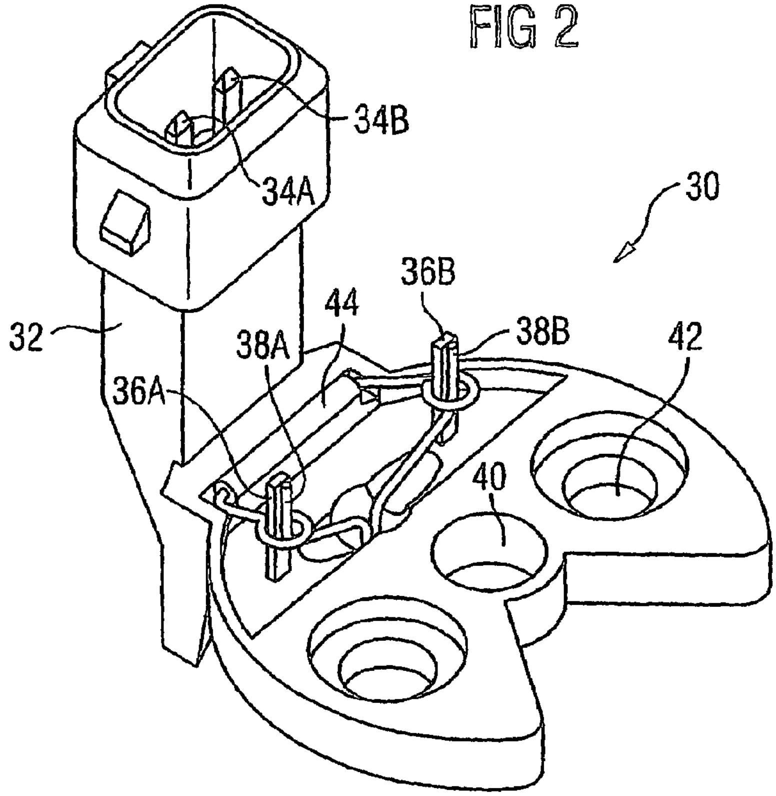
FIG. 2 is a perspective view of the electrical connector of FIG. 1.

The thermal compensator 20 is provided to fix the position of the piezoelectric actuator 18 during fast changes of its length, but compensates for slow changes in the position of the piezoelectric actuator 18 due to, for example, thermal changes. FIG. 2 shows a perspective view of the electrical connector 30 of FIG. 1 in detail. The connector 30 contains a plastic connector body 32 and a first set of pins rigidly mounted in the connector body 32 and having first end pieces 34A, 34B and second end pieces 36A, 36B for connection to an external power supply. The electrical connector 30 further contains a second set of pins having first end pieces to provide electrical contact to the piezoelectric actuator 18 and second end pieces 38A, 38B fixed to and electrically connected with the second end pieces 36A, 36B of the first set of pins.

The plastic connector body 32 is molded at an early stage of the manufacturing process of the electrical connector 10. During this process, the main part of the electrical pins is encapsulated in the plastic material. Only the first and second end pieces protrude from the plastic body 32, as shown in FIG. 2.

The second end pieces 38A and 38B of the second set of pins are welded to the second end pieces 36A and 36B of the first set of pins, respectively. Also, the second end pieces 38A and 38B of the second set of pins each have a flexible bending area in the shape of an divergent "L" stretching from the outlet opening 40 in the connector body 32 to the welding area, where the end pieces 38A and 38B are connected to the second end pieces 36A and 36B of the first set of pins.

The flexible bending areas allows for axial oscillations of the piezoelectric actuator 18 and of the second set of pins contacting the piezoelectric actuator 18, with an amplitude of about 10 μm. Throughout these oscillations they maintain a stable and reliable electrical contact between the piezoelectric actuator 18, the second set of pins and the first set of pins.

An electrical resistor 44, for example a 200 kOhm resistor, is welded or braised to the terminals of the first set of pins. As shown in FIG. 2, the resistor 44 is also partially encapsulated into the plastic body 32 of the connector.

Further, the connector body 32 has two fastening holes 42, into which two screws can be inserted in order to fasten the modular connector 30 to the housing 12 of the injection valve 10.

Figure 3:
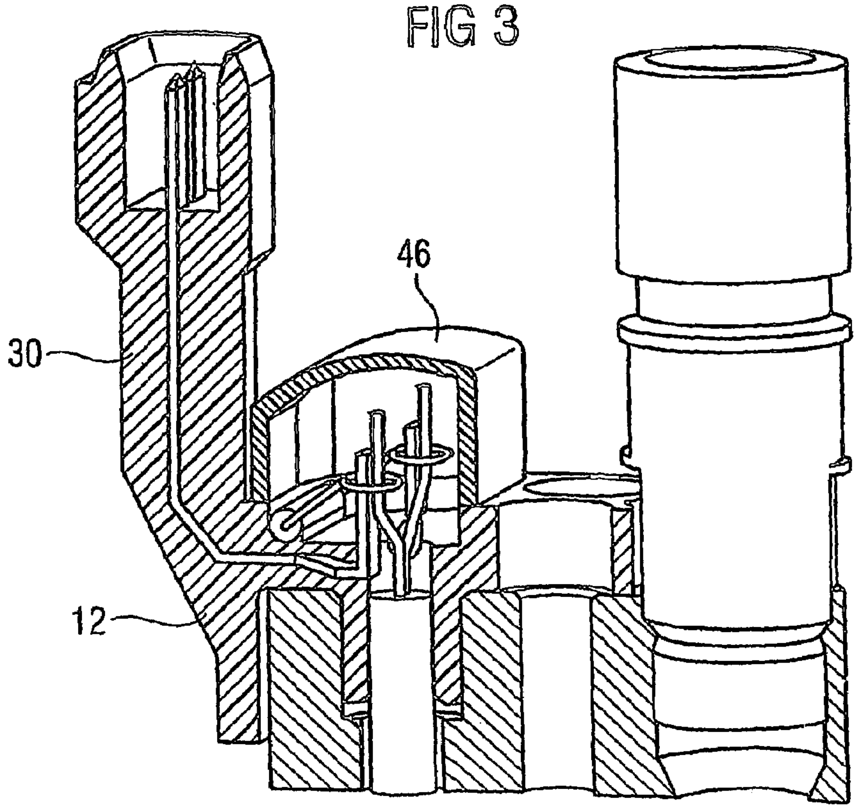
FIG. 3 is a side view of the electrical connector of FIG. 1.

To allow free axial oscillations of the second pins with their divergent "L" shape projecting from the outlet opening 40 through a terminal adapter, and to provide sufficient room for the bending in their flexible bending areas, a free space is provided above the outlet surface of the connector body 32 is provided. This free space is encapsulated by a protective cap 46, shown in the side view of FIG. 3.

The protective cap 46 is ultrasonically welded to the connector body 32 and preserves the free space atop the flexible bending areas of the second pins against environmental contaminations such as water or gasoline.

To prevent possible intrusions of the injection valve, for example intrusions through clearances between the modular connector 10 and the housing 12 or between the protective cap 46 and the modular connector body, sealing elements such as O-rings may be inserted for insulation.

The features disclosed in the foregoing description, in the drawings, and in the claims may alone as well as in any possible combination be important for the realization of the invention.

What we claim is:

1. An injection valve for a fuel injection system in an internal combustion engine, said valve comprising a housing having a metering opening, the opening and closing of the housing controlled by the movement of an axially moveable valve needle, an axially extendable piezoelectric actuator cooperating with the valve needle to control its axial movement, a thermal compensator unit cooperating with the piezoelectric actuator and the housing to compensate for different thermal expansions of the housing and the piezoelectric actuator to ensure elastic contact between an end stop of the housing, the piezoelectric actuator and the valve needle, and an electrical connector for supplying electrical power to the piezoelectric actuator, said electrical connector comprising a connector body having a first set of pins rigidly mounted in the connector body adapted to be connected with an external power supply, and a second set of pins axially moveably mounted in the connector body electrically connected to the first set of pins and providing electrical contact to the piezoelectric actuator.

2. A metering device according to claim 1, wherein each pin of the first set has first and second end pieces, the first end pieces are adapted to be connected with the external power supply and the second end pieces are electrically connected to the axially moveable pins of the second set of pins.

3. A metering device according to claim 2, wherein each pin of the second set has first and second end pieces, the first end pieces provide electrical contact to the piezoelectric actuator and the second end pieces are fixed and electrically connected to the second end pieces of the first set of pins.

4. A metering device according to claim 3, wherein the second end pieces of the second set of pins are welded or braised to the second end pieces of the first set of pins.

5. A metering device according to claim 3, wherein the second end pieces of the second set of pins have a flexible bending area allowing axial oscillations of the second set of pins.

6. A metering device according to claim 4, wherein the second end pieces of the second set of pins have a flexible bending area allowing axial oscillations of the second set of pins.

7. A metering device according to claim 5, wherein the flexible bending area is formed in an divergent “L” shape.

8. A metering device according to claim 3, wherein the electrical connector comprises a molded connector body, encapsulating the pins with the exception of their first and second end pieces.

9. A metering device according to claim 4, wherein the electrical connector comprises a molded connector body, encapsulating the pins with the exception of their first and second end pieces.

10. A metering device according to claim 5, wherein the electrical connector comprises a molded connector body, encapsulating the pins with the exception of their first and second end pieces.

11. A metering device according to claim 6, wherein the electrical connector comprises a molded connector body, encapsulating the pins with the exception of their first and second end pieces.

12. A metering device according to claim 1, wherein an electrical resistor is connected between a first and a second pin of the first set of pins.

13. The metering device according to claim 12, wherein the electrical resistor is at least partially encapsulated in the connector body.

14. A metering device according to claim 1, wherein the connector body comprises at least one fastening hole to receive a fastening member for attaching the connector body to the housing of the metering device.

15. A metering device according to claim 1, wherein the connector body comprises at least one metal insert adapted to be welded to the housing of the metering device.

16. A metering device according to claim 1, wherein the connector body and the housing of the metering device comprise corresponding engagement means to attach the electrical connector to the housing of the metering device.

17. A metering device according to claim 1, wherein the electrical connector is provided with a protective cap preserving the axial oscillation area of the second end pieces of the second pin set above an outlet surface of the connector body.

18. A metering device according to claim 17, wherein the protective cap is ultrasonically welded to the connector body.

19. A metering device according to claim 17, wherein a sealing element is provided between the connector body and the housing of the metering device.

20. A metering device according to claim 18, wherein a sealing element is provided between the connector body and the housing of the metering device.

21. The metering device according to claim 19, wherein the sealing element is formed by a sealing ring.

22. An injection valve for a fuel injection system in an internal combustion engine, said valve comprising a housing having a metering opening, the opening and closing of the housing controlled by the movement of an axially moveable valve needle, an axially extendable piezoelectric actuator cooperating with the valve needle to control its axial movement, a thermal compensator unit cooperating with the piezoelectric actuator and the housing to compensate for different thermal expansions of the housing and the piezoelectric actuator to ensure elastic contact between an end stop of the housing, the piezoelectric actuator and the valve needle, and an electrical connector for supplying electrical power to the piezoelectric actuator, said electrical connector comprising a connector body having a first set of pins rigidly mounted in the connector body adapted to be connected with an external power supply, and a second set of pins welded to the first set of pins and providing electrical contact to the piezoelectric actuator, wherein the second set of pins is axially moveable.

* * * * *